(12) United States Patent  
Xu et al.

(10) Patent No.: US 9,136,181 B2  
(45) Date of Patent: Sep. 15, 2015

(54) METHOD FOR MANUFACTURING SEMICONDUCTOR DEVICE

(71) Applicant: Institute of Microelectronics, Chinese Academy of Sciences, Beijing (CN)

(72) Inventors: Qiuxia Xu, Beijing (CN); Huilong Zhu, Poughkeepsie, NY (US); Gaobo Xu, Beijing (CN); Huajie Zhou, Beijing (CN); Dapeng Chen, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 5 days.

(21) Appl. No.: 14/355,919

(22) PCT Filed: Dec. 7, 2012

(86) PCT No.: PCT/CN2012/086126  
§ 371 (c)(1),  
(2) Date: May 2, 2014

(87) PCT Pub. No.: WO2014/082334  
PCT Pub. Date: Jun. 5, 2014

(65) Prior Publication Data  
US 2015/0170974 A1 Jun. 18, 2015

(30) Foreign Application Priority Data  
Nov. 30, 2012 (CN) .......................... 2012 1 0505744

(51) Int. Cl.  
H01L 21/8238 (2006.01)  
H01L 29/78 (2006.01)  
(Continued)

(52) U.S. Cl.  
CPC .... H01L 21/823857 (2013.01); H01L 21/0228 (2013.01); H01L 21/0254 (2013.01);  
(Continued)

(58) Field of Classification Search  
None  
See application file for complete search history.

(56) References Cited

U.S. PATENT DOCUMENTS 6,033,963 A * 3/2000 Huang et al. .................. 438/303  
6,444,592 B1 * 9/2002 Ballantine et al. ............ 438/770

FOREIGN PATENT DOCUMENTS

CN 1902741 A 1/2007  
CN 101447454 A 6/2009  
(Continued)

OTHER PUBLICATIONS

International Search Report for corresponding International Application No. PCT/CN2012/086126, mailed Aug. 29, 2013 (3 pages).  
(Continued)

Primary Examiner — Bilkis Jahan  
Assistant Examiner — Kevin Quinto  
(74) Attorney, Agent, or Firm — Osha Liang LLP

(57) ABSTRACT

A method for manufacturing a semiconductor device, comprising: defining an active region on the semiconductor substrate; forming an interfacial oxide layer on a surface of the semiconductor substrate; forming a high-K gate dielectric on the interfacial oxide layer; forming a first metal gate layer on the high-K gate dielectric; forming a dummy gate layer on the first metal gate layer; patterning the dummy gate layer, the first metal gate layer, the high-K gate dielectric and the interfacial oxide layer to form a gate stack structure; forming a gate spacer surrounding the gate stack structure; forming S/D regions for NMOS and PMOS respectively; depositing interlayer dielectric and planarization by CMP to expose the surface of dummy gate layer; removing the dummy gate layer so as to form a gate opening; implanting dopant ions into the first metal gate layer; forming a second metal gate layer on the first metal gate layer so as to fill the gate opening; and performing annealing, so that the dopant ions diffuse and accumulate at an upper interface between the high-K gate dielectric and the first metal gate layer and at a lower interface between the high-K gate dielectric and the interfacial oxide layer, and electric dipoles are generated by interfacial reaction at the lower interface between the high-K gate dielectric and the interfacial oxide layer.

20 Claims, 6 Drawing Sheets

(51) Int. Cl.
*H01L 29/49* (2006.01)
*H01L 29/51* (2006.01)
*H01L 21/02* (2006.01)
*H01L 21/266* (2006.01)
*H01L 21/28* (2006.01)
*H01L 21/3105* (2006.01)
*H01L 21/321* (2006.01)
*H01L 21/3213* (2006.01)
*H01L 21/324* (2006.01)
*H01L 29/167* (2006.01)
*H01L 29/423* (2006.01)
*H01L 29/66* (2006.01)

(52) U.S. Cl.
CPC ........ *H01L21/266* (2013.01); *H01L 21/28141* (2013.01); *H01L 21/31051* (2013.01); *H01L 21/324* (2013.01); *H01L 21/3212* (2013.01); *H01L 21/3213* (2013.01); *H01L 21/823842* (2013.01); *H01L 29/167* (2013.01); *H01L 29/42364* (2013.01); *H01L 29/42372* (2013.01); *H01L 29/4966* (2013.01); *H01L 29/517* (2013.01); *H01L 29/66545* (2013.01); *H01L 29/78* (2013.01)

(56) References Cited

FOREIGN PATENT DOCUMENTS

| | | |
|---|---|---|
| CN | 101800196 A | 8/2010 |
| CN | 102339858 A | 2/2012 |

OTHER PUBLICATIONS

Written Opinion for corresponding International Application No. PCT/CN2012/086126, mailed Aug. 29, 2013 (5 pages).

* cited by examiner

METHOD FOR MANUFACTURING SEMICONDUCTOR DEVICE

PRIORITY

This application is a National Phase application of, and claims priority to, PCT Application No. PCT/CN2012/086126, filed on Dec. 7, 2012, entitled "METHOD FOR MANUFACTURING SEMICONDUCTOR DEVICE", which claimed priority to Chinese Application No. 201210505744.X, filed on Nov. 30, 2012. Both the PCT Application and Chinese Application are incorporated herein by reference in their entireties.

TECHNICAL FIELD

The present disclosure relates to semiconductor technology, and particularly to a method for manufacturing a semiconductor device comprising a metal gate and a high-K gate di electric.

BACKGROUND

As the development of semiconductor technology, feature sizes of metal-oxide-semiconductor-field-effect transistors (MOSFETs) decrease continuously. The size decreasing of the MOSFETs causes a severe problem of gate current leakage. The gate leakage current can be reduced by using a high-K gate dielectric, which may have an increased physical thickness with a constant equivalent oxide thickness (EOT). However, conventional Poly-Si gate is incompatible with the high-K gate dielectric. Combination of a metal gate and the high-K gate dielectric not only avoids the exhaustion effect of the Poly-Si gate and decrease gate resistance, but also avoid penetration of boron and enhance device reliability. Therefore, the combination of the metal gate and the high-K gate dielectric is widely used in the MOSFETs. However, integration of the metal gate and the high-K gate dielectric is still confronted with many challenges, such as problems related to thermostability and interface state. Particularly, due to Fermi-Pinning Effect, it is difficult for the MOSEFT using the metal gate and the high-K dielectric to have an appropriately low threshold voltage.

In a complementary-metal-oxide-semiconductor (CMOS) device integrating an N-type MOSFET (NMOSFET) and a P-type MOSFET (PMOSFET), to obtain appropriate threshold voltages, the NMOSFET should have an effective work function near the bottom of the conduction band of Si (about 4.1 eV), while the PMOSFET should have an effective work function near the top of the valence band of Si (about 5.2 eV). Different combinations of the metal gate and the high-K dielectric may be selected respectively for the NMOSFET and PMOSFET, so as to realize required threshold voltages. As a result, dual metal gates and dual high-K dielectrics need to be formed in one chip. During manufacture of the CMOS device, usually multi-deposition, photolithography and etching steps for the metal gates and the high-K dielectrics gate stack are performed respectively for the NMOSFET and the PMOSFET. Therefore, the method for manufacturing semiconductor devices comprising the dual metal gates and the dual gate dielectrics is complicated and thus is not suitable for mass production, which further leads to high cost.

SUMMARY

The present disclosure intends to provide a method for manufacturing a semiconductor device, by which it is possible to adjust an effective work function of the semiconductor device during manufacturing process thereof.

The present disclosure provides a method for manufacturing a semiconductor device, comprising: defining an active region on a semiconductor substrate; forming an interfacial oxide layer on a surface of the semiconductor substrate; forming a high-K gate dielectric on the interfacial oxide layer; forming a first metal gate layer on the high-K gate dielectric; forming a dummy gate layer on the first metal gate layer; patterning the dummy gate layer, the first metal gate layer, the high-K gate dielectric and the interfacial oxide layer to form a gate stack structure; forming a gate spacer surrounding the gate stack structure; forming S/D regions for NMOS and PMOS respectively; depositing interlayer dielectric and planarization by CMP to exposure the surface of dummy gate layer; removing the dummy gate layer so as to form a gate opening; implanting the different type of dopant ions into the different type of the areas of the first metal gate layer; forming a second metal gate layer on the first metal gate layer so as to fill the gate opening; and performing annealing, so that the dopant ions diffuse and accumulate at an upper interface between the high-K gate dielectric and the first metal gate layer and at a lower interface between the high-K gate dielectric and the interfacial oxide layer, and electric dipoles are generated by interfacial reaction at the lower interface between the high-K gate dielectric and the interfacial oxide layer. In a preferable embodiment, the semiconductor structure may comprise an NMOSFET and a PMOSFET formed on one semiconductor substrate. Moreover, in the preferable embodiment, a dopant may be implanted in the first metal gate layer of the NMOSFET to decrease an effective work function thereof, and another dopant may be implanted in the first metal gate layer of the PMOSFET to increase an effective work function thereof.

In this method, in one aspect, the dopant ions accumulated at the upper interface between the high-K gate dielectric and the first metal gate layer change characteristics of a metal gate, thereby adjusting an effective work function of a corresponding MOSFET advantageously. In a further aspect, the dopant ions accumulated at the lower interface between the high-K gate dielectric and the interfacial oxide layer form the electric dipoles with appropriate polarities by the interfacial reaction, thereby further adjusting the effective work function of the corresponding MOSFET advantageously. The semiconductor device obtained by this method has good stability and the effective work function of the metal gate can be advantageously adjusted. Different dopants may be selected for the two types of MOSFETs to decrease or increase the effective work functions. In CMOS devices, threshold voltages of the two types of MOSFETs can be adjusted respectively simply by changing the dopants, instead of using different combinations of the metal gates and the gate dielectrics. Accordingly, this method can remove corresponding multi-steps of deposition, mask and etching, so as to simplify the process and enable mass production.

BRIEF DESCRIPTION OF THE DRAWINGS

In order to provide a thorough understanding of the present disclosure, the present disclosure will be explained in detail based on the accompanying drawings.

DETAILED DESCRIPTION

Figure 1:
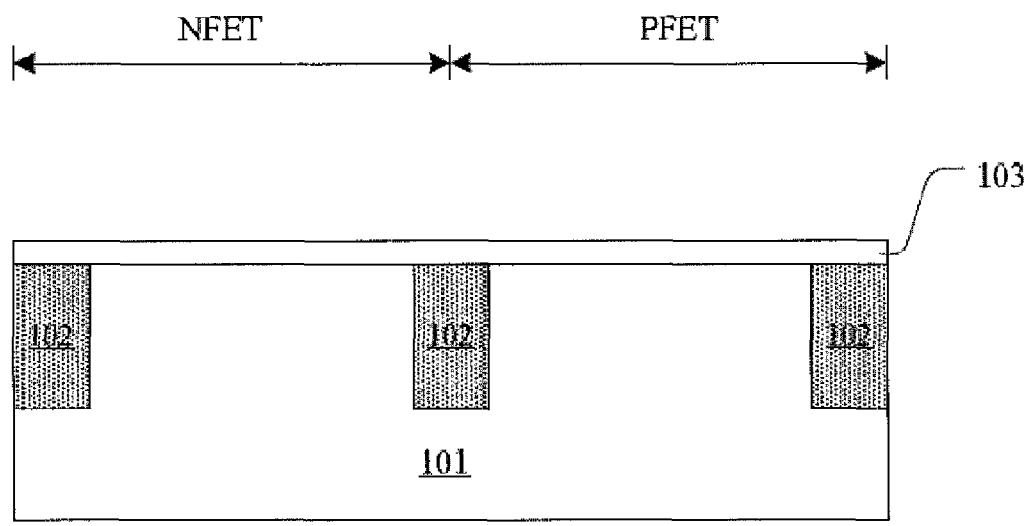
FIGS. 1-11 schematically show sectional views of respective semiconductor structures during each stage of manufacturing a semiconductor device according to an embodiment of the present disclosure.

Next, the present disclosure will be explained in detail with references to accompanying drawings. In the following description, similar parts are represented by the same or similar reference signs, regardless of whether they are shown in different embodiments. Respective parts in the drawings are not drawn to scale for the sake of clarity.

In the following description, numerous specific details are set forth, such as structures, materials, sizes and treatment processes and technologies of devices, in order to provide a thorough understanding of the present disclosure. However, it will be understood by those of ordinary skill in the art that the present invention may be practiced without these specific details. Each portion of the semiconductor device may consist of materials well known to those of ordinary skill in the art, or materials having similar function developed in future, unless noted otherwise.

In the present disclosure, the term "semiconductor structure" refers to a semiconductor substrate and all the layers or regions formed on the semiconductor substrate after corresponding steps of manufacturing a semiconductor device. The term "S/D region" refers to either one of a source region and a drain region of a MOSFET, and both of the source region and the drain region are represented with a same reference sign. The term "N-type dopant" refers to a dopant applied to an NMOSFET and capable of decreasing its effective work function. The term "P-type dopant" refers to a dopant applied to a PMOSFET and capable of increasing its effective work function.

A method for manufacturing a semiconductor device will be illustrated with references to FIGS. 1-11, according to one embodiment of the present disclosure. The semiconductor device is a CMOS device comprising an NMOSFET and a PMOSFET formed on one semiconductor substrate.

The semiconductor structure as shown in FIG. 1 has gone through part of CMOS process. On a semiconductor substrate 101 (e.g., a Si substrate) there are provided an active region for the NMOSFET and an active region for the PMOSFET, separated by a shallow trench insulation 102.

An interfacial oxide layer 103 (e.g., a silicon oxide layer) is formed on an exposed surface of the semiconductor substrate 101 by chemical oxidation or additional thermal oxidation. In one embodiment, the interfacial oxide layer 103 may be formed by rapid thermal oxidation at a temperature of about 600-900° C. within about 20-120 seconds. In another embodiment, the interfacial oxide layer 103 may be formed by chemical oxidation in water solution containing ozone ($O_3$).

Preferably, the surface of the semiconductor substrate 101 may be cleansed before the interfacial oxide layer 103 is formed. Cleansing the semiconductor substrate 101 may comprise cleansing the semiconductor substrate 101 normally and then immersing the semiconductor substrate 101 in mixed solution including hydrofluoric acid, isopropanol and water. After that, the semiconductor substrate 101 may be washed with deionized water, and then spin-dried. In one embodiment, the hydrofluoric acid, isopropanol and water in the mixed solution may have a volume ratio of about 0.2-1.5%:0.01-0.10%:1, and the time duration for immersing the semiconductor substrate 101 in the mixed solution may be about 1-10 minutes. Cleansing the semiconductor substrate 101 can obtain a clean surface of the semiconductor substrate 101, thereby inhibiting particle pollution and generation of natural oxidation on the surface of silicon, and thus help to form the interfacial oxide layer 103 with high quality.

Figure 2:
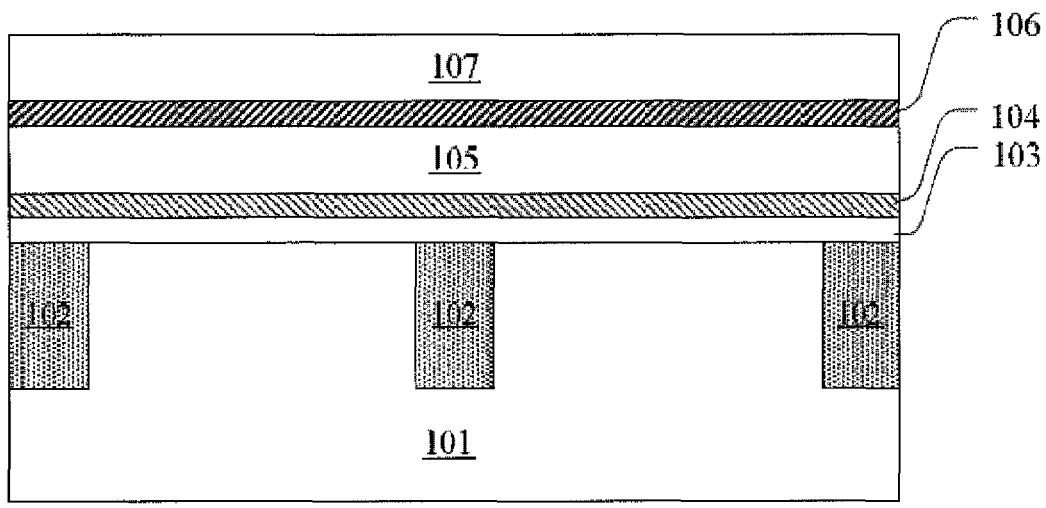

Then, by deposition processes, for example, ALD (atomic layer deposition), CVD (chemical vapor deposition), MOCVD (metal organic chemical vapor deposition), PVD (physical vapor deposition), sputtering and so on, a high-K gate dielectric 104, a first metal gate layer 105, a barrier layer 106 and a dummy gate layer 107 is formed on the surface of the semiconductor structure in sequence, as shown in FIG. 2.

The high-K gate dielectric 104 may comprise any appropriate material with a dielectric constant greater than that of $SiO_2$, such as any one selected from $ZrO_2$, ZrON, ZrSiON, HfZrO, HfZrON, HfON, $HfO_2$, HfAlO, HfAlON, HfSiO, HfSiON, HfLaO, HfLaON, and any combination thereof. The first metal gate layer 105 may comprise any appropriate material capable of forming a metal gate, such as any one selected from TiN, TaN, MoN, WN, TaC, and TaCN. The barrier layer 106 may comprise any material capable of blocking reaction and inter-diffusion between the dummy gate layer 107 and the first metal gate layer 105, such as any one selected from TaN, MN and TiN. The dummy gate layer 107 may comprise a Poly-Si layer or a a-Si layer. It is to be noted that the barrier layer 106 is optional. The barrier layer 106 is not necessary if there is no reaction and inter-diffusion between the dummy gate layer 107 and the first metal gate layer 105. In one embodiment, the high-K gate dielectric 104 may be a $HfO_2$ layer having a thickness of about 1.5-5 nm, the first metal gate layer 105 may be a TiN layer having a thickness of about 2-30 nm, the barrier layer 106 may be a TaN layer having a thickness of about 3-8 nm, and the dummy gate layer 107 may be a Poly-Si layer having a thickness of 30-120 nm, for example.

Preferably, post-deposition-annealing of the high-K gate dielectric may be performed between forming the high-K gate dielectric 104 and forming the first metal gate layer 105, so as to improve quality of the high-K dielectric layer, which benefits to obtain a uniform thickness of the first metal gate layer 105 formed subsequently. In one embodiment, rapid thermal annealing at a temperature of about 500-1000° C. within about 5-100 seconds may be performed as the post-deposition-annealing.

Figure 3:
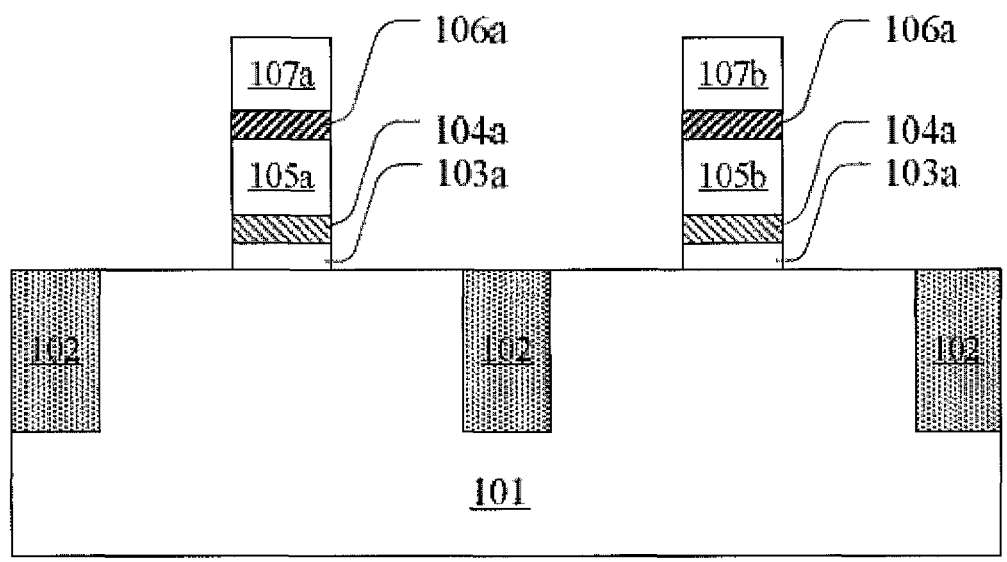

Then, a plurality of gate stack structures are formed by patterning using a photoresist mask (not shown) or a hard mask (not shown). During the patterning, exposure portions of the dummy gate layer 107, the barrier layer 106, the first metal gate layer 105, the high-K gate dielectric 104 and the interfacial oxide layer 103 are selectively removed by dry etching, such as ion-milling etching, plasma etching, reactive ion etching, or laser ablation, or by wet etching using etchant solution, so as to form the gate stack structures of the NMOSFET and the PMOSFET respectively, as shown in FIG. 3. The gate stack structure of the NMOSFET as shown in FIG. 3 comprises a dummy gate layer 107a, a barrier layer 106a, a first metal gate layer 105a, a high-K gate dielectric 104a and an interfacial oxide layer 103a. The gate stack structure of the PMOSFET comprises a dummy gate layer 107b, a barrier layer 106b, a first metal gate 105b, a high-K gate dielectric 104b and an interfacial oxide layer 103b.

During the patterning for forming the gate stack structures, different etchants may be applied to different layers. In one embodiment, etchant gas based on F, etchant gas based on Cl or etchant gas based on $HBr/Cl_2$ may be applied in dry etching of the dummy gate layer 107. Etchant gas based on $BCl_3/Cl_2$ may be applied in dry etching of the first metal gate layer 105 and/or the high-K gate dielectric 104. Preferably, Ar and/or $O_2$ may be added into the aforementioned etchant gases to improve etching effect. It is desirable that the gate stack structures have steep and continuous etching profiles, high anisotropy, and high etching selectivity with respect to the silicon substrate in order to avoid any damage to the silicon substrate.

Figure 4:
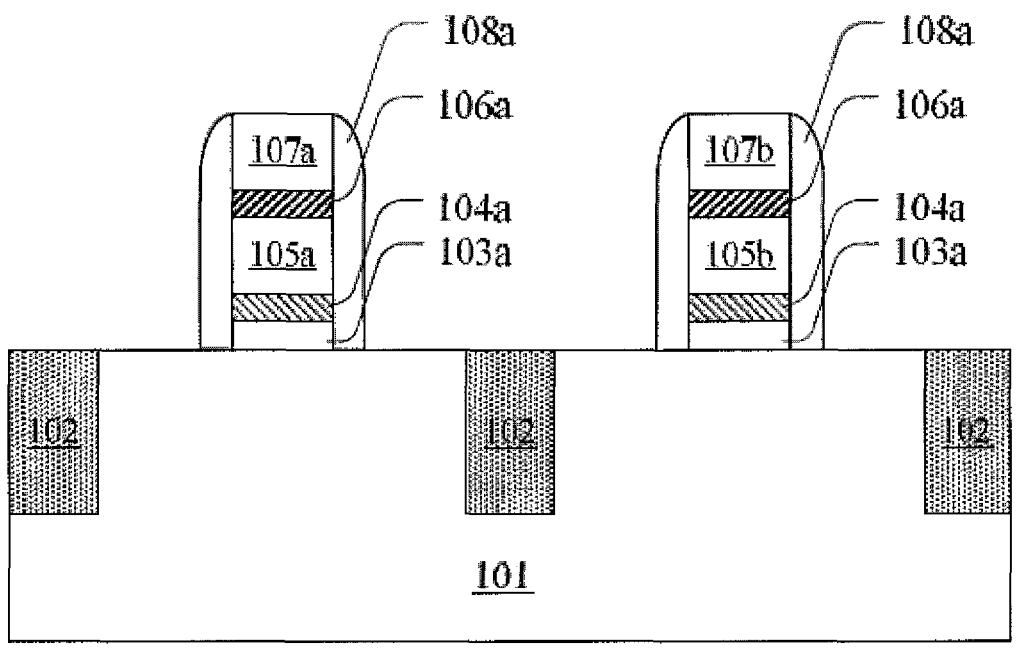

Then, by the aforementioned deposition processes, a silicon nitride layer having a thickness of about 10-50 nm may be formed on the surface of the semiconductor structure. Then, anisotropy etching may be performed to the silicon nitride layer, so that a spacer 108a surrounding the gate stack structure is formed in the active region of the NMOSFET, and a spacer 108b surrounding the gate stack structure is formed in the active region of the PMOSFET, as shown in FIG. 4.

Figure 5:
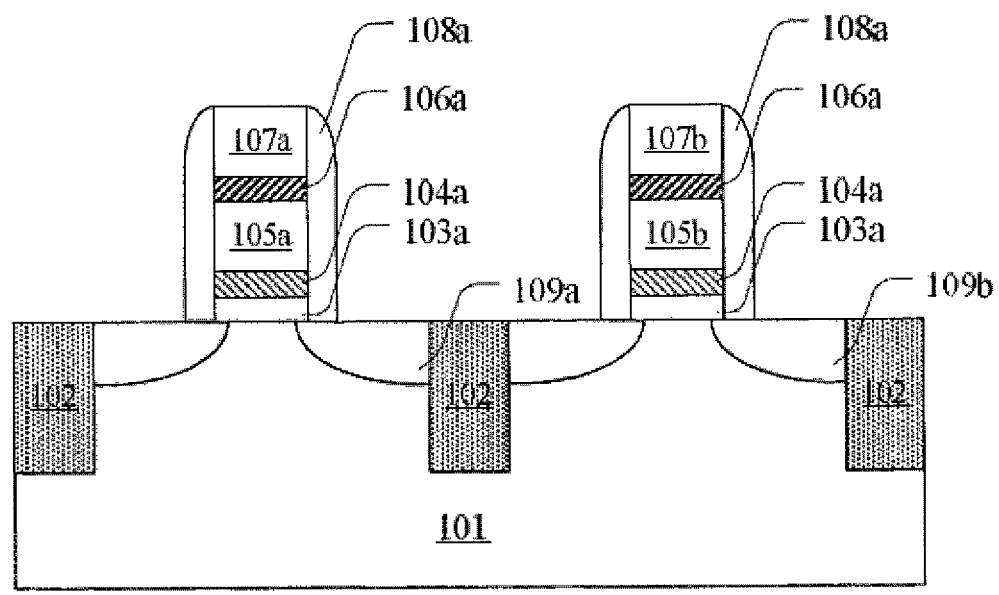

Then, the gate stack structures and the spacers thereof are used as hard masks to perform S/D ion implantation, and then activation annealing is performed. Therefore, S/D regions 109a of the NMOSFET and S/D regions 109b of the PMOSFET are formed in the semiconductor substrate 101, as shown in FIG. 5. The S/D regions 109a of the NMOSFET locate at both sides of the gate stack structure thereof, and may comprise extension regions at least partly extending to under the high-K gate dielectric 104a. The S/D regions 109b of the PMOSFET locate at both sides of the gate stack structure thereof, and may comprise extension regions at least partly extending to under the high-K gate dielectric 104b. Due to protection of the dummy gate layers 107a and 107b, dopant ions implanted during the S/D ion implantation will not enter the first metal gate layers 105a and 105b, which helps to adjust the effective work functions during subsequent implantation in metal gates.

Rapid thermal annealing (RTA), spike annealing, laser annealing, and microwave annealing may be performed for the activation annealing of the S/D regions. The temperature for the annealing may be about 950-1100° C., and the time duration for the annealing may be about 2 ms-30 s.

Figure 6:
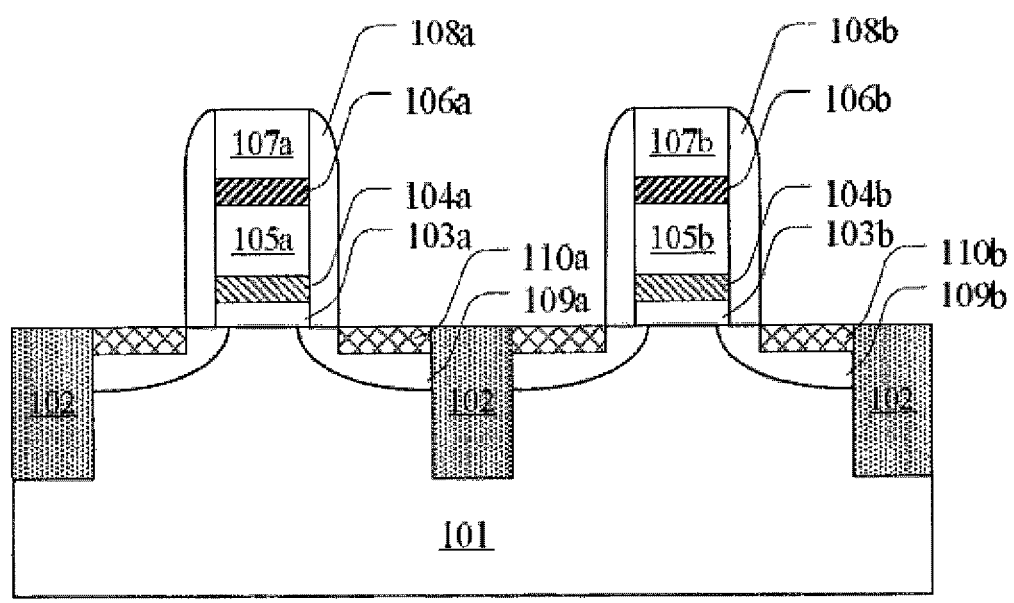

Then, silicide regions 110a (e.g., nickel silicide, nickel platinum silicide) may be formed at the surface of the S/D regions 109a, and silicide regions 110b (e.g., nickel silicide, nickel platinum silicide) may be formed at the surface of the S/D regions 109b, as shown in FIG. 6. The silicide regions can decrease series resistance and contact resistance of the S/D regions.

Figure 7:
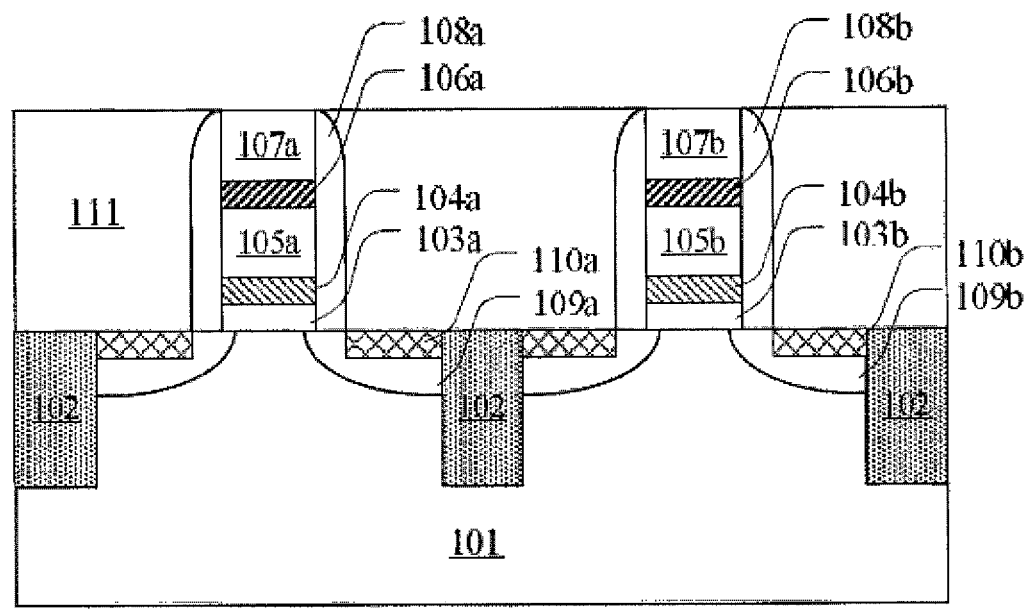

Then, by the aforementioned deposition processes, an interlayer dielectric layer 111 (e.g., a silicon nitride layer or a silicon oxide layer) covering the active regions may be formed on the surface of the semiconductor structure. By chemical-mechanical polishing (CMP), the surface of the interlayer dielectric layer 111 is planarized, and top surfaces of the dummy gate layers 107a and 107b is exposed, as shown in FIG. 7.

Figure 8:
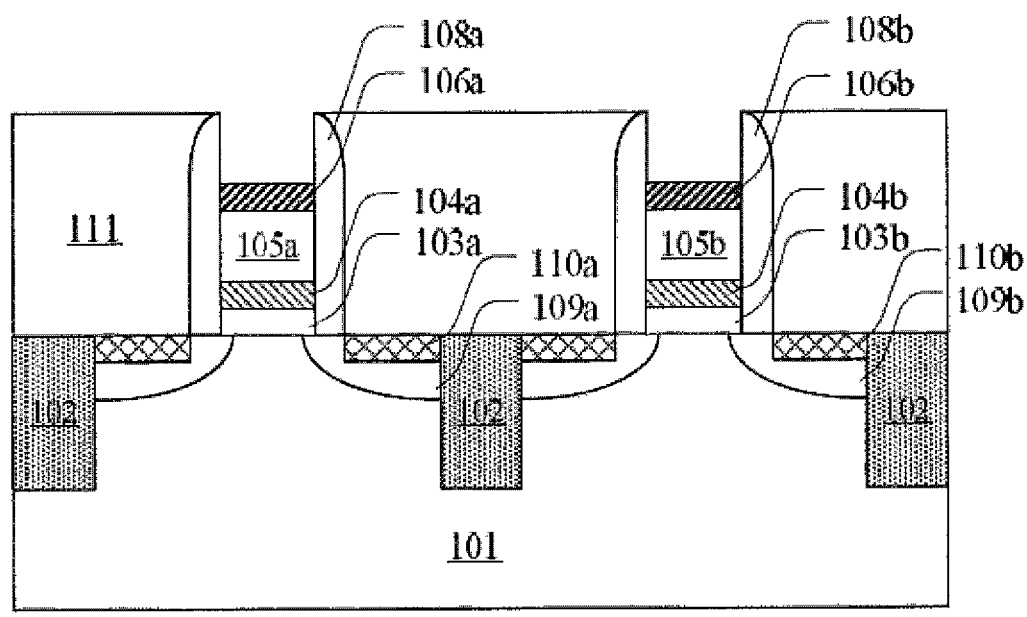
Figure 9:
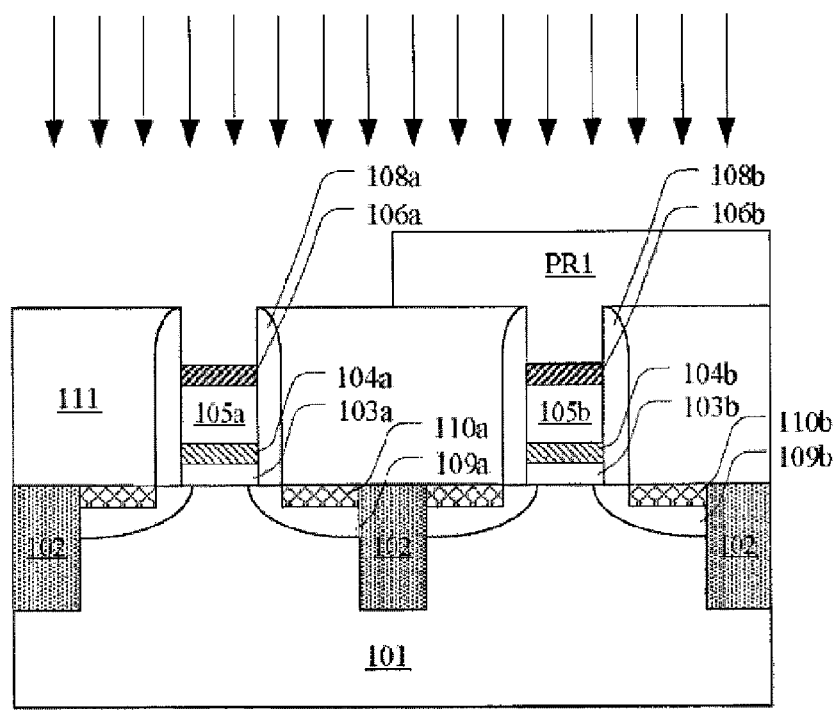

Then, the dummy gate layers 107a and 107b are selectively removed with respect to the interlayer dielectric layer 111, by dry etching, such as ion-milling etching, plasma etching, reactive ion etching, or laser ablation, or by wet etching using etchant solution, so as to form a plurality of gate openings, as shown in FIG. 8.

Then, by photolithography process including exposure and development, a patterned photoresist mask PR1 is formed, so as to cover the active region of the PMOSFET and expose the active region of the NMOSFET. Ion implantation is performed using the photoresist mask PR1 through the corresponding gate opening to implant N-type dopant in the first metal gate layer 105a in the active region of the NMOSFET, as shown in FIG. 8. The N-type dopant for the metal gate may be one selected from a group consisting of P, As, Sb, La, Er, Dy, Gd, Sc, Yb, Er and Tb. By controlling energy and dosage of the ion implantation, the implanted dopant ions only distribute in the first metal gate layer 105a without entering the high-K gate dielectric 104a. Moreover, by controlling the energy and the dosage of the ion implantation, the first metal gate layer 105a can have an appropriate dopant depth and an appropriate dopant concentration, so that a desired threshold voltage can be obtained. In one embodiment, the energy of the ion implantation is about 0.2 KeV-30 KeV, the dosage of the ion implantation is about 1E13-1E15 cm$^2$. The photoresist mask PR1 is removed by ashing or dissolution after the aforementioned ion implantation.

Figure 10:
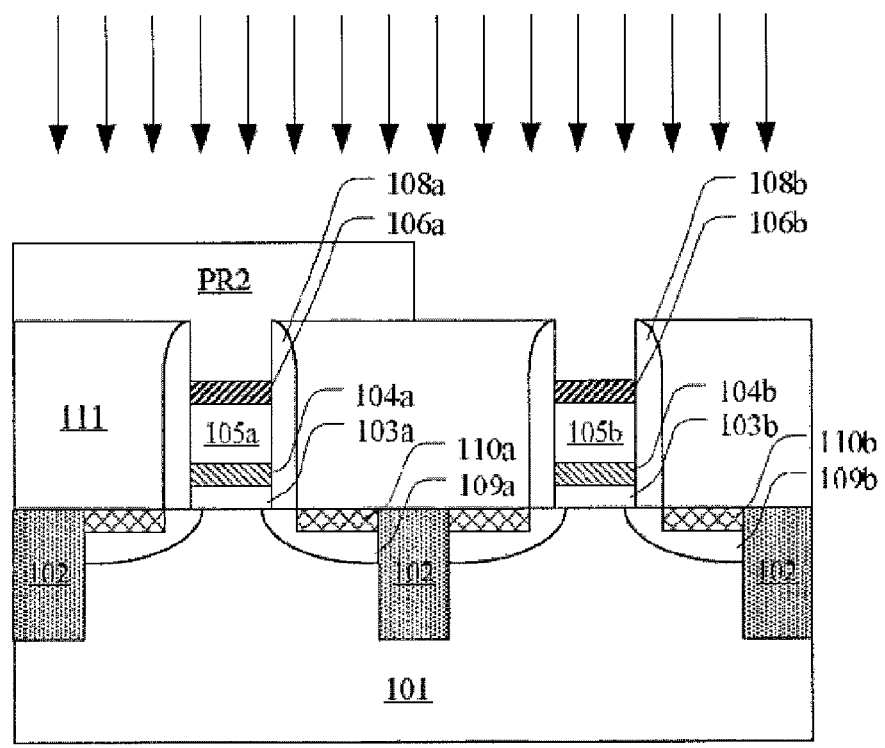

Then, by photolithography process including exposure and development, a patterned photoresist mask PR2 is formed, so as to cover the active region of the NMOSFET and expose the active region of the PMOSFET. Ion implantation is performed using the photoresist mask PR2 through the corresponding gate opening to implant P-type dopant in the first metal gate layer 105b in the active region of the PMOSFET, as shown in FIG. 10. The P-type dopant for the metal gate can be one selected from a group consisting of In, B, $BF_2$, Ru, W, Mo, Al, Ga and Pt. By controlling energy and dosage of the ion implantation, the implanted dopant ions only distribute in the first metal gate layer 105b without entering the high-K gate dielectric 104b, and the first metal gate layer 105b can have an appropriate dopant depth and an appropriate dopant concentration, so that a desired threshold voltage can be obtained. In one embodiment, the energy of the ion implantation is about 0.2 KeV-30 KeV, and the dosage of the ion implantation is about 1E13-1E15 cm$^{-2}$. The photoresist mask PR2 is removed by ashing or dissolution after the aforementioned ion implantation.

Figure 11:
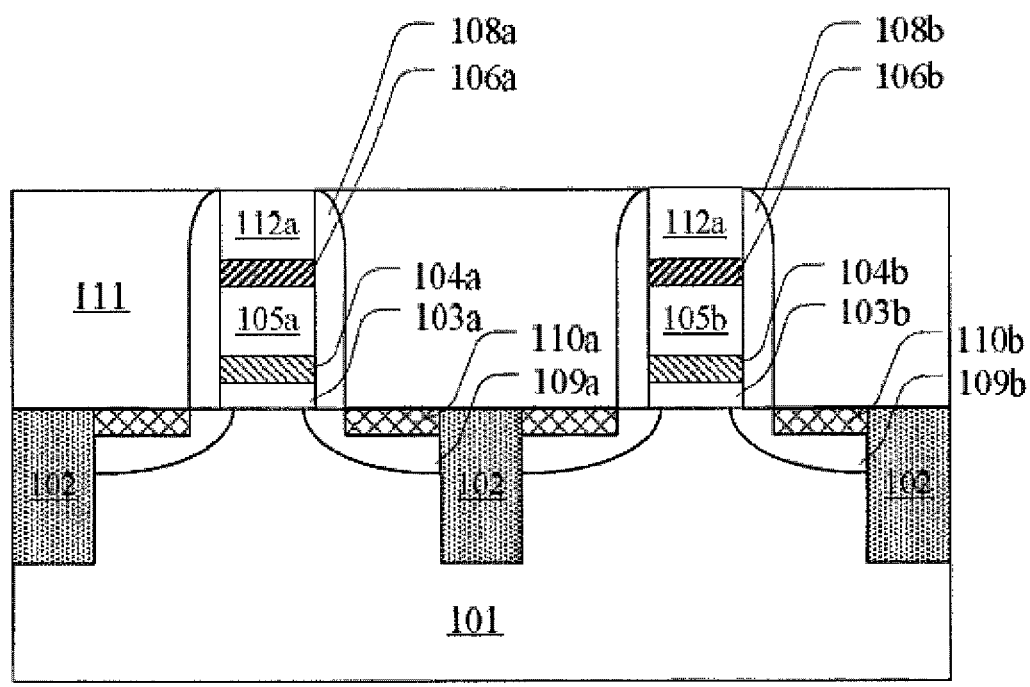

Then, by the aforementioned deposition processes, a second metal gate layer is formed on the surface of the semiconductor structure. CMP is performed using the interlayer dielectric layer 111 as a polishing stop layer, so as to remove part of the second metal gate layer locating outside the gate openings while reserve part of the second metal gate layer locating inside the gate openings, as shown in FIG. 11. The second metal gate layer may comprise a material identical or non-identical to the material comprised in the first metal gate layer, such as one selected from a group consisting of W, Ti, TiAl, Al, Mo, Ta, TiN, TaN, WN, and any combination thereof. In one embodiment, the second metal gate layer may be a W layer having a thickness of about 30-80 nm, for example. The gate stack structure of the NMOSFET as shown comprises the second metal gate layer 112a, the barrier layer 106a, the first metal gate layer 105a, the high-K dielectric 104a, and the interfacial oxide layer 103a. The gate stack structure of the PMOSFET as shown comprises the second metal gate layer 112b, the barrier layer 106b, the first metal gate layer 105b, the high-K gate dielectric 104b, and the interfacial oxide layer 103b. Although the gate stack structures of the NMOSFET and the PMOSFET are formed by the same layers, the metal gates of the NMOSFET and the PMOSFET comprise opposite types of dopant ions, which perform opposite adjusting functions to the respective effective work functions.

After contact formation and metallization are performed, annealing of the aforementioned semiconductor structure is performed within inert atmosphere (e.g., $N_2$) or weakly reducing atmosphere (e.g., combination of $N_2$ and $H_2$). In one embodiment, the annealing is performed in a furnace at a temperature of about 350-450° C. for about 20-90 minutes. The annealing force the dopant ions implanted to diffuse and accumulate at upper interfaces and lower interfaces of the high-K gate dielectrics 104a and 104b, and further form electric dipoles by interfacial reaction at the lower interfaces of the high-K dielectrics 104a and 104b. The upper interfaces of the high-K dielectrics 104a and 104b herein refer to interfaces between the high-K dielectrics 104a and 104b and the first metal gate layers 105a and 105b thereon. The lower interfaces of the high-K dielectrics 104a and 104b herein refer to interfaces between the high-K dielectrics 104a and 104b and the interfacial oxide layers 103a and 103b thereunder.

The annealing changes distribution of the dopant ions. In one aspect, the dopant ions accumulated at the upper interfaces of the high-K gate dielectrics 104a and 104b change characteristics of the metal gates, thereby adjusting the effective work functions of the corresponding MOSFETs advantageously. In a further aspect, the dopant ions accumulated at the lower interfaces of the high-K gate dielectric layers 104a and 104b form the electric dipoles with appropriate polarities by the interfacial reaction, thereby further adjusting the effective work functions of the corresponding MOSFETs advantageously.

Not every detail of the MOSFETs, such as formation of S/D contact, formation of additional interlayer dielectric layer and formation of conductive path, has been disclosed in the foregoing disclosure. Standard CMOS processes for forming the aforementioned portions are well known to those of ordinary skill in the art, and thus description thereof is omitted.

It should be noted that the foregoing only illustrates examples and describes the present disclosure, but not intends to exhaust and limit the present disclosure. Therefore, the present disclosure is not limited to the aforementioned embodiments. Any alternatives or modification obvious to those of ordinary skill in the art will fall within the scope of the present disclosure without departing from the spirit and principle thereof.

We claim:

1. A method for manufacturing a semiconductor device, comprising:
    defining active regions on a semiconductor substrate;
    forming an interfacial oxide layer on a surface of the semiconductor substrate;
    forming a high-K gate dielectric on the interfacial oxide layer;
    forming a first metal gate layer on the high-K gate dielectric;
    forming a dummy gate layer on the first metal gate layer;
    patterning the dummy gate layer and/or the first metal gate layer and/or the high-K gate dielectric and/or the interfacial oxide layer, to form a gate stack structure;
    forming a gate spacer surrounding the gate stack structure;
    forming S/D regions for NMOS and PMOS respectively;
    depositing interlayer dielectric and planarization by CMP to expose the surface of the dummy gate layer, removing the dummy gate layer so as to form a gate opening;
    implanting dopant ions into the first metal gate layer;
    forming a second metal gate layer on the first metal gate layer so as to fill the gate opening; and
    performing annealing, so that the dopant ions diffuse and accumulate at an upper interface between the high-K gate dielectric and the first metal gate layer and at a lower interface between the high-K gate dielectric and the interfacial oxide layer, and electric dipoles are generated by interfacial reaction at the lower interface between the high-K gate dielectric and the interfacial oxide layer.

2. The method for manufacturing the semiconductor device according to claim 1, wherein the high-K gate dielectric comprises one selected from a group consisting of $ZrO_2$, ZrON, ZrSiON, HfZrO, HfZrON, HfON, $HfO_2$, HfAlO, HfAlON, HfSiO, HfSiON, HfLaO, HfLaON, and any combination thereof.

3. The method for manufacturing the semiconductor device according to claim 1, wherein the high-K gate dielectric has a thickness of about 1.5-5 nm.

4. The method for manufacturing the semiconductor device according to claim 1, wherein the high-K gate dielectric is formed by atomic layer deposition, physical vapor deposition, or metal organic chemical vapor deposition.

5. The method for manufacturing the semiconductor device according to claim 4, further comprising post-deposition-annealing after forming the high-K gate dielectric, so as to improve quality of the high-K dielectric.

6. The method for manufacturing the semiconductor device according to claim 1, wherein the first metal gate layer comprises one selected from a group consisting of TiN, TaN, MoN, WN, TaC, TaCN, and any combination thereof.

7. The method for manufacturing the semiconductor device according to claim 1, wherein the first metal gate layer has a thickness of about 2-30 nm.

8. The method for manufacturing the semiconductor device according to claim 1, wherein the second metal gate layer comprises one selected from a group consisting of W, Ti, TiAl, Al, Mo, Ta, TiN, TaN, WN, and any combination thereof.

9. The method for manufacturing the semiconductor device according to claim 1, wherein in the step of implanting the dopant ions into the first metal gate layer, energy and dosage of the ion implantation are controlled according to a desired threshold voltage so that the implanted dopant ions are only distributed in the first metal gate layer.

10. The method for manufacturing the semiconductor device according to claim 9, wherein the energy of the ion implantation is about 0.2 KeV-30 KeV.

11. The method for manufacturing the semiconductor device according to claim 9, wherein the dosage of the ion implantation is about 1E13-1E15 $cm^2$.

12. The method for manufacturing the semiconductor device according to claim 1, wherein the semiconductor device comprises an NMOSFET and a PMOSFET formed on one semiconductor substrate, and wherein the step of implanting the dopant ions into the first metal gate layer comprises:
    performing ion implantation in the first metal gate layer of the NMOSFET using a first dopant with the PMOSFET being covered by the photoresist; and
    performing ion implantation in the first metal gate layer of the PMOSFET using a second dopant with the NMOSFET being covered by the photoresist.

13. The method for manufacturing the semiconductor device according to claim 12, wherein the first dopant is capable of decreasing an effective work function.

14. The method for manufacturing the semiconductor device according to claim 13, wherein the first dopant is one selected from a group consisting of P, As, Sb, La, Er, Dy, Gd, Sc, Yb, Er and Tb.

15. The method for manufacturing the semiconductor device according to claim 12, wherein the second dopant is capable of increasing an effective work function.

16. The method for manufacturing the semiconductor device according to claim 15, wherein the second dopant is one selected from a group consisting of In, B, $BF_2$, Ru, W, Mo, Al, Ga and Pt.

17. The method for manufacturing the semiconductor device according to claim 1, wherein the annealing is performed within an inert atmosphere or in forming gas at a temperature of about 350-450° C. for about 20-90 minutes.

18. The method for manufacturing the semiconductor device according to claim 1, wherein the dummy gate layer comprises a Poly-Si layer or an Amorphous-Si layer.

19. The method for manufacturing the semiconductor device according to claim 1, further comprising forming a barrier layer between the step of forming the first metal gate layer and the step of forming the dummy gate layer, so that the gate stack structure further comprises the barrier layer.

20. The method for manufacturing the semiconductor device according to claim 19, wherein the barrier layer is one selected from a group consisting of TaN, MN and TiN and any combination thereof.

* * * * *